United States Patent
Dobbs et al.

(10) Patent No.: US 7,307,437 B1
(45) Date of Patent: Dec. 11, 2007

(54) ARRANGEMENT WITH CONDUCTIVE PAD EMBEDMENT

(75) Inventors: Robert Dobbs, Granite Bay, CA (US); Sachin Navin Chheda, Roseville, CA (US); Nitin Bhagwath, Lincoln, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/089,379

(22) Filed: Mar. 24, 2005

(51) Int. Cl.
*G01R 31/02* (2006.01)

(52) U.S. Cl. ...................... 324/758; 324/754

(58) Field of Classification Search ........ 324/754–758; 361/795, 799; 174/255, 262
See application file for complete search history.

(56) References Cited

U.S. PATENT DOCUMENTS

| | | | |
|---|---|---|---|
| 3,963,986 A | 6/1976 | Morton et al. | |
| 4,223,968 A | 9/1980 | Kawabata et al. | |
| 4,471,298 A | 9/1984 | Frohlich | |
| 4,494,172 A * | 1/1985 | Leary et al. | 361/780 |
| 4,694,245 A | 9/1987 | Frommes | |
| 5,191,174 A * | 3/1993 | Chang et al. | 174/266 |
| 5,508,938 A * | 4/1996 | Wheeler | 716/19 |
| 5,576,630 A * | 11/1996 | Fujita | 324/760 |
| 6,133,744 A * | 10/2000 | Yojima et al. | 324/754 |
| 6,147,505 A * | 11/2000 | Ott et al. | 324/754 |
| 6,181,004 B1 * | 1/2001 | Koontz et al. | 257/691 |
| 6,229,095 B1 * | 5/2001 | Kobayashi | 174/255 |
| 6,469,530 B1 * | 10/2002 | Johnson et al. | 324/754 |
| 6,479,758 B1 * | 11/2002 | Arima et al. | 174/260 |
| 6,647,311 B1 * | 11/2003 | Goff | 700/125 |
| 6,817,870 B1 * | 11/2004 | Kwong et al. | 439/74 |
| 6,863,576 B2 | 3/2005 | Campbell et al. | |
| 6,864,696 B2 | 3/2005 | Logelin et al. | |
| 6,879,492 B2 * | 4/2005 | Alcoe et al. | 361/748 |
| 6,906,541 B2 * | 6/2005 | Kimura | 324/754 |
| 6,967,398 B2 * | 11/2005 | Frech et al. | 257/691 |
| 6,992,496 B2 * | 1/2006 | Winter et al. | 324/755 |
| 7,069,646 B2 * | 7/2006 | Duxbury et al. | 29/830 |

* cited by examiner

*Primary Examiner*—Ha Tran Nguyen
*Assistant Examiner*—Arleen M. Vazquez

(57) ABSTRACT

A plurality of conductive pads of an apparatus in one example are disposed on a circuit board in a predetermined arrangement compatible with an arrangement of probes on an external test connector. One or more of the plurality of conductive pads is disposed on an embedded layer of the circuit board.

15 Claims, 2 Drawing Sheets

ARRANGEMENT WITH CONDUCTIVE PAD EMBEDMENT

BACKGROUND

Many electronic products include high-density printed circuit boards (PCBs) that are densely populated with electronic components. Because of their complexity, it is generally desirable to subject each PCB to a thorough test prior to additional assembly operations that may act to make the PCBs inaccessible.

Automated testing is generally considered desirable because of the high testing speed and accuracy attainable through automation. In order to ensure access to required signals on a PCB under test, a test connector is sometimes provided that aggregates desired signals within a small area of the PCB. It is known in the art to use edge connectors, for example, in order to provide test equipment access to these signals.

A physical electrical connector may also be utilized to provide the necessary interface with selected electrical signals on the PCB under test. To perform a test sequence, an operator plugs a mating connector into the test connector provided on the PCB. For testing some kinds of PCBs, a sequentially applied probe is sometimes used to make electrical contact with isolated test pads provided on an exterior layer of the PCB under test.

SUMMARY

The invention in one implementation encompasses an apparatus. The apparatus comprises a plurality of conductive pads disposed on a circuit board in a predetermined arrangement compatible with an arrangement of probes on an external test connector. One or more of the plurality of conductive pads is disposed on an embedded layer of the circuit board.

Another implementation of the invention encompasses a process. The process comprises the step of disposing a plurality of conductive pads on a circuit board in a predetermined arrangement compatible with an arrangement of probes on an external test connector. One or more of the plurality of conductive pads is disposed on an embedded layer of the circuit board.

The invention in another implementation comprises an apparatus. The apparatus comprises means for disposing a plurality of conductive pads on a circuit board in a predetermined arrangement compatible with an arrangement of probes on an external test connector. One or more of the plurality of conductive pads is disposed on an embedded layer of the circuit board.

DESCRIPTION OF THE DRAWINGS

Features of exemplary implementations of the invention will become apparent from the description, the claims, and the accompanying drawings in which:

DETAILED DESCRIPTION

Referring to the BACKGROUND section above, the signal path complexities within a dense, multi-layer circuit board often render impracticable the routing of signals desired for testing to a board edge, where the contact fingers of an edge-type connector are disposed. An additional complication arises because the signal lines must all be routed either to the top or bottom conductive layer of the circuit board for edge-type connection.

A dedicated test connector adds product cost that has little or no value once the product has been tested and is ready for shipment to a customer. Also of concern for test connector installation is the general requirement for through-hole mounting for most suitable connectors styles. Although it may be possible to use a surface-mount type of connector for test purposes, desired test signals would have to appear on the board surface, and this is known to be difficult on high-density boards. It is also undesirable to use sequential probing of board surface test points, since this process extends test time. In any case, for at least some test sequences, it is desirable to be able to connect to at least some desired signals simultaneously.

The apparatus and method described herein, in one implementation, aggregate signals desired for testing purposes within a relatively small board area, and provide a suitable connector arrangement for interface with an off-board test connector system. This connector arrangement provides a reliable test connection without using a physical electrical connector.

In one example, an economical and robust test connector is disposed on a circuit board under test. The test connector includes an arrangement of conductive pads coupled to signals desired for a board test procedure. The conductive pads may be disposed on embedded layers of the circuit board to ease the routing of desired signals to the test connector region of the circuit board. For conductive pads on these embedded layers, surface pads may be provided in vertical alignment with the embedded conductive pads, with openings provided through the surface pads down to the embedded conductive pads. Plating may be added to enhance the durability of the test connector.

Figure 1:
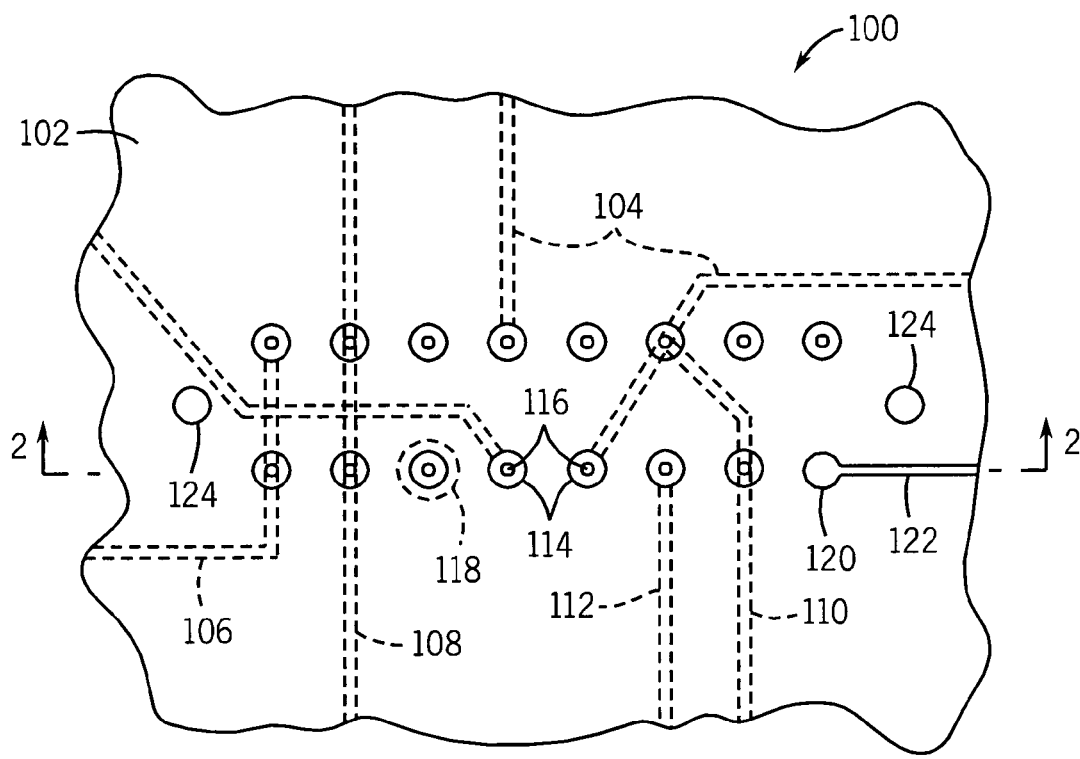
FIG. 1 is a top view of one exemplary implementation of a circuit board illustrating an arrangement of embedded conductive pads for test purposes.

FIG. 1 is a top view of a portion of a circuit board 100 that aggregates test connections in a geometrically regular arrangement within a small circuit board area. The arrangement illustrated includes sixteen surface pads 114, although sixteen are shown strictly for illustration purposes. Any suitable number of conductive pads could be provided to satisfy system testing requirements. The circuit board 100 illustrated in FIG. 1 is a multi-layer board. Consequently, most of the signal paths 104 are depicted in dashed lines, since these signal paths 104 are disposed on conductive layers below the surface layer 102.

Figure 2:
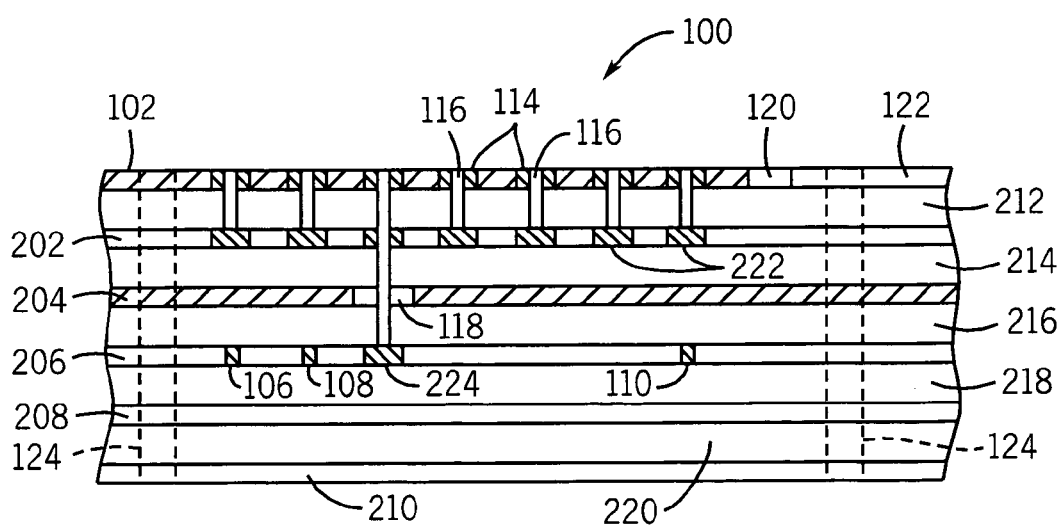
FIG. 2 is a section view of the circuit board of FIG. 1 along section lines 2-2.

FIG. 2 is a section view of the circuit board 100 illustrating both conductive layers and non-conductive layers of the multi-layer board structure. The illustrated board 100 is a six-layer board, since there are conductive layers 102, 202, 204, 206, 208, and 210 that can be utilized to route signals, as well as to provide power and ground connections. The six-layer structure is shown for purposes of illustration only, and the method and apparatus described will function equally well on a multi-layer board having any number of conductive layers.

In one implementation, the test connector arrangement is disposed in a regular geometric pattern for ease of interface with a mating off-board test connector employed for automated testing. The surface conductive pads 114, which are registered to be in vertical alignment with underlying test pads 222, 224, may be disposed in a rectangular array, as illustrated in FIG. 1. The pads 114 may be placed on 0.200 inch centers, for example, with 0.400 inch spacing between the two rows of eight conductive pads each.

In the illustrated implementation, at least one of the signals desired for test purposes is routed to a conductive pad on an interior conductive layer of the circuit board 100. For example, desired test signals are routed to the conductive pads 222 that are disposed on conductive layer 202, which is the first conductive layer below the surface layer 102. Conductive pads 222 that are disposed on a conductive layer 202 that is below the surface layer 102 are often termed embedded pads.

It is not necessary that all of the signals desired for test purposes be routed to embedded pads, nor is it necessary that all of the conductive pads be disposed on the same layer. In the illustrated implementation, one of the test pads 120 actually appears on the surface layer 102 of the board 100. It is often possible to route at least one of the signals desired for test purposes to a surface pad. Conductive path 122 routes this exemplary test signal to surface pad 120. Another desired test signal is routed to embedded test pad 224, which is disposed on interior conductive layer 206.

In some complex, multi-layer circuit boards, it becomes desirable to devote entire conductive layers to power supply or ground distribution. Conductive layer 204 in FIG. 2 is a power distribution layer. In order to provide access to embedded test pad 224, an antipad, or void region 118, is created in the power layer 204. FIG. 2 also illustrates how conductive paths 106, 108, and 110, all on interior conductive layer 206, are routed directly through the test connector arrangement without interfering with test connector usage. Of course, an embedded test pad may also be disposed on a power layer 204, although this is not illustrated in the drawing. It is sometimes desirable for an automated testing system to sample power supply voltages, and to be coupled to the ground layer, of a circuit board under test.

Figure 3:
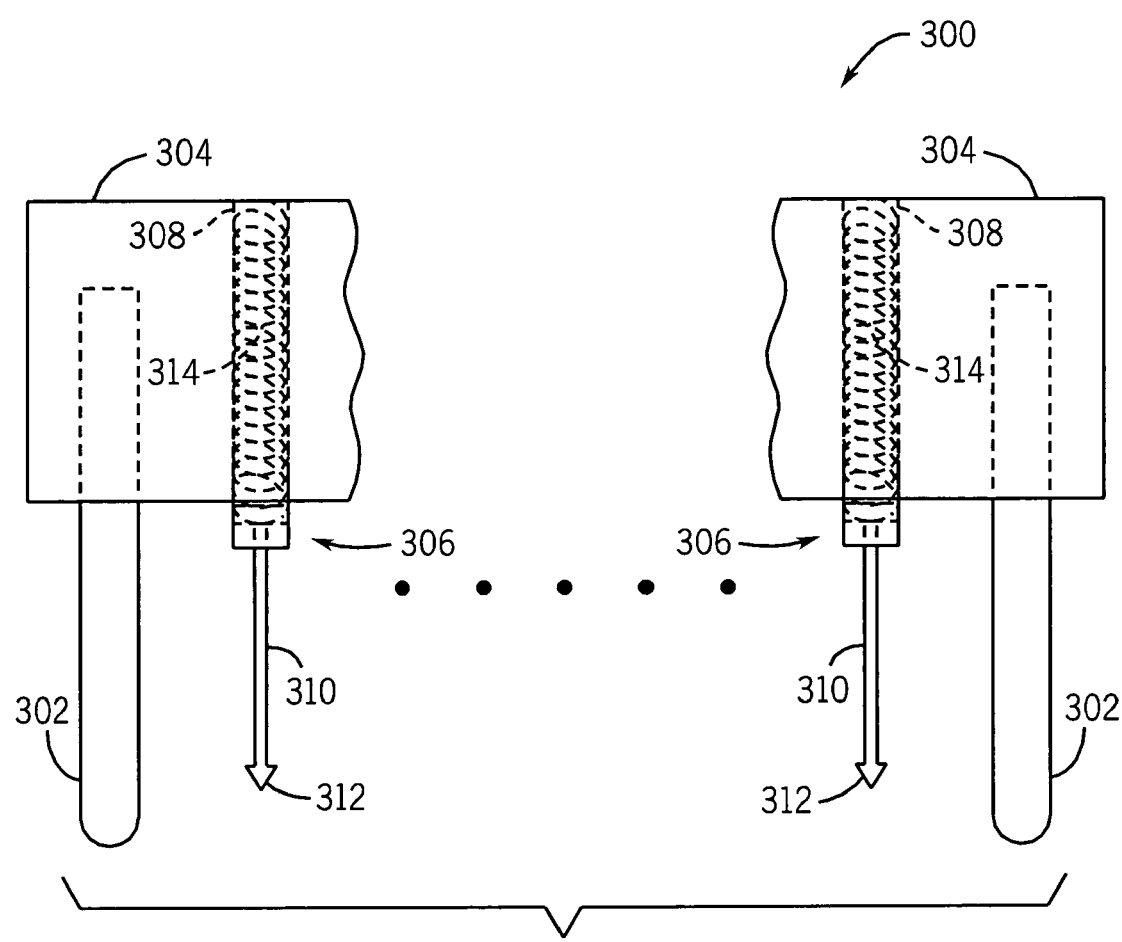
FIG. 3 is a side view of a test connector suitable for engagement with the arrangement of embedded conductive pads illustrated in FIGS. 1 and 2.

Locating features 124 are also provided in the circuit board 100. In one implementation, these locating features 124 are openings provided through the circuit board 100 in predetermined locations. If signal density on some interior conductive layers is of particular concern, these openings need not penetrate the circuit board 100 completely. FIG. 3 depicts an off-board test connector 300 that is suitable for use with the test connector arrangement depicted in FIGS. 1 and 2. In one implementation, the test connector 300 includes a plurality of test pins 306 disposed on a test pin frame or holder 304. Locator pins 302 extend from the frame 304 in carefully predetermined locations. The locator pins 302 are just slightly smaller in diameter than the locating features 124 on the circuit board 100. This provision of locator pins 302 ensures that the test pins 306 are properly registered with the corresponding test pads disposed on the circuit board 100.

The test pins 306 include a pin base 308 and a probe portion 310 that ends in a probe tip 312. The pin base 308 includes a spring 314 that biases the probe portion 310 downward. The spring action ensures good electrical contact between the probe tip 312 and the mating test pad on the circuit board 100. The spring action also allows the probe tips to make satisfactory electrical contact with test pads on different conductive layers of the circuit board 100. Electrical connections between the probe portions 310 and mating electronic test equipment are provided by routing through the holder 304 to an associated test cable assembly, although this is not illustrated in the drawing.

In operation, the circuit board 100 under test is positioned in a test fixture such that the off-board test connector 300 is positioned directly above the test connector arrangement depicted in FIGS. 1 and 2. The test fixture automatically lowers the test connector 300 so that the locator pins 302 ease gently into the locating features 124 provided on the circuit board 100. Generally, the test connector 300 is coupled to the test fixture in such a way that a limited amount of lateral travel is permitted. In this case, even with a small registration error, the locating pins 302 will still be guided into the locating features 124, and the probe tips 312 will engage with the appropriate mating test pads on the circuit board 100. In order to minimize side-to-side tolerances between locator pins 302 and probe tips 312, the frame or holder 304, in one implementation, substantially surrounds the pin bases 308 and the adjacent portions of the locator pins 302, as shown in FIG. 3.

To fabricate the test connector arrangement depicted in FIGS. 1 and 2, conductive pad constraints are supplied to the auto-router to ensure that the desired test signals are routed to proper terminal conductive pads without restrictions on which layer of the circuit board the test pads are actually disposed on. These modest constraints, coupled with the fact that no through-hole mounting is required for a physical connector, practically guarantee that the desired test signals can be routed to the proper region in terms of vertical alignment of test pads.

Conductive pads 114 are provided on each conductive layer of the circuit board 100 above the layer containing the test pad to which the desired test signal is routed. For example, for test pad 224, which is embedded on layer 206, a conductive pad 222 is provided on layer 202 in proper vertical registration directly above the test pad 224. In the case of test pad 224, as discussed above, it is necessary to provide an antipad 118 on layer 204 because layer 204 is a power supply layer.

A power supply layer in a multi-layer circuit board generally has a high conductor density. In other words, the conductive layer on a power supply layer may be a virtually continuous sheet of conductive material. It should also be noted that the term "power supply" can refer to positive or negative voltages provided to components mounted on the circuit board 100, or to ground potential. Some systems can require more than one type of ground distribution, such as a digital ground and an analog ground.

An opening 116 is then drilled (using mechanical or laser drilling, for example) through each of the surface pads 114 that overlies an embedded test pad 222 or 224. The opening 116 is drilled only until the drill bit makes contact with the underlying test pad 222. The opening 116 is constrained to be larger in diameter than the probe tip 312 intended to make electrical contact with the underlying test pad 222 (or 224). For cases where the test pad 120 is actually on the surface 102, no drilling operation is required. In either case, solder mask is applied to separate adjacent test pad regions.

The circuit board 100 is then plated in accordance with conventional circuit board fabrication techniques. One of ordinary skill in the applicable art will readily apprehend that the plating process will solder plate the embedded test pad 222 (or 224), and the openings 116 will allow the test probe tip 312 to penetrate to the test pad 222 (or 224). The plated areas are then flash plated with a nickel-gold alloy (Type I plating, as it is known in the industry) to create a robust receptacle for the mating probe tip 312 of the off-board test connector 300 (FIG. 3).

Rather than mechanical or laser drilling, an etching process may be employed in an alternative implementation.

After the copper circular pads 114 are created on the surface conductive layer 102 of the circuit board 100, with solder mask applied to separate the adjacent pads 114 from one another, the surface of the circuit board 100 is covered with photo resist. Using a photo mask revealing the locations of the openings 116, the photo resist is flashed and developed. Using the appropriate chemistry, well understood by those skilled in the art, the openings 116 are provided by etching. Forming the openings in the non-conductive layers 212, 214, 216, 218, 220 as required may also be accomplished through further etching, or the etching process may be supplemented at this stage by mechanical or laser drilling. The same solder plating and nickel-gold flash processes described above are then applied to the circuit board 100 to place the test connector arrangement into its final form.

Rather than mechanical or laser drilling, an etching process may be employed in an alternative implementation. After the copper circular pads 114 are created on the surface conductive layer 102 of the circuit board 100, with solder mask applied to separate the adjacent pads 114 from one another, the surface of the circuit board 100 is covered with photo resist. Using a photo mask revealing the locations of the openings 116, the photo resist is flashed and developed. Using the appropriate chemistry, well understood by those skilled in the art, the openings 116 are provided by etching. Forming the openings in the non-conductive layers 212, 214, 216, 218, 220 as required may also be accomplished through further etching, or the etching process may be supplemented at this stage by mechanical or laser drilling. The same solder plating and nickel-gold flash processes described above are then applied to the circuit board 100 to place the test connector arrangement into its final form.

The embedded test pad 222 (or 224) allows inner layers of a circuit board 100 to be probed without adding extra capacitance to the signal path. Through-plating of the openings 116 between the surface layer and the embedded pad is deliberately avoided in the exemplary implementation to minimize capacitance at the test point. Prior art techniques that sample signals on interior conductive layers through buried vias experience lumped capacitance at the test point and consequent signal quality issues.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. A multi-layer circuit board, comprising:
    a plurality of conductive layers;
    one or more non-conductive layers, wherein a non-conductive layer of the one or more non-conductive layers is located between first and second conductive layers of the plurality of conductive layers; and
    a test-signal passage that comprises:
        a conductive pad located on the second conductive layer;
        a through-opening in the non-conductive layer;
        a through-opening in the first conductive layer;
        wherein the conductive pad comprises an exposed conductive face in a general direction toward the first conductive layer;
        wherein the through-openings of the non-conductive layer and the first conductive layer cooperate to expose the exposed conductive face through the non-conductive layer to an exterior face of the first conductive layer;
        wherein the test-signal passage avoids conductive contact with the exposed conductive face and walls of the through-openings of the non-conductive layer and the first conductive layer.

2. The multi-layer circuit board of claim 1, wherein the test-signal passage comprises:
    the conductive pad located on the second conductive layer;
    the through-opening in the non-conductive layer;
    a through-opening in a conductive pad of an interior conductive layer, of the plurality of conductive layers, located between the first and second conductive layers;
    the through-opening in the first conductive layer;
    wherein the through-openings of the non-conductive layer, the first conductive layer, and the conductive pad of the interior conductive layer cooperate to expose the exposed conductive face of the conductive pad on the second conductive layer to the exterior face of the first conductive layer through the through-opening in the non-conductive layer and through the through-opening in the conductive pad of the interior conductive layer;
    wherein the test-signal passage avoids conductive contact with the exposed conductive face and walls of the through-openings of the non-conductive layer, the first conductive layer, and the conductive pad of the interior conductive layer.

3. The multi-layer circuit board of claim 2, wherein the interior conductive layer comprises at least a portion of a non-test signal conductive path superimposed in part by the conductive pad on the second conductive layer.

4. The multi-layer circuit board of claim 1, wherein the test-signal passage comprises:
    the conductive pad located on the second conductive layer;
    the through-opening in the non-conductive layer;
    an antipad of a power layer, of the plurality of conductive layers, located between the first and second conductive layers;
    the through-opening in the first conductive layer;
    wherein the through-openings of the non-conductive layer and the first conductive layer and the antipad of the power layer cooperate to expose the exposed conductive face of the conductive pad on the second conductive layer to the exterior face of the first conductive layer through the through-opening in the non-conductive layer and through the antipad of the power layer;
    wherein the test-signal passage avoids conductive contact with the exposed conductive face, walls of the through-openings of the non-conductive layer and the first conductive layer, and walls of the antipad.

5. The multi-layer circuit board of claim 1, wherein one or more alignment holes extend into and/or through the first conductive layer, wherein one or more of the one or more alignment holes are employable for receipt and/or alignment of one or more alignment pins of a non-dedicated off-board test connector.

6. The multi-layer circuit board of claim 5, wherein the one or more alignment holes stop at one or more corresponding depths partially through the multi-layer circuit board.

7. The multi-layer circuit board of claim 5, wherein the non-dedicated off-board test connector comprises one or more test probes;

wherein upon receipt by and/or alignment of the one or more alignment pins of the non-dedicated off-board test connector with the one or more of the one or more alignment holes, a test probe of the one or more test probes is employable to follow the test-signal passage through the exterior face of the first conductive layer, with avoidance of conductive contact with walls of the through-openings of the non-conductive layer and the first conductive layer, to couple with the exposed conductive face of the conductive pad on the second conductive layer.

8. The multi-layer circuit board of claim 1, wherein the second conductive layer comprises at least a portion of a non-test signal conductive path superimposed in part by a test pad located on the exterior face of the first conductive layer.

9. A multi-layer circuit board, comprising:
a plurality of conductive layers that comprises first, second, and third conductive layers;
a first test-signal path that comprises:
a first conductive pad located on the second conductive layer;
a first through-opening in the first conductive layer, wherein the first conductive pad comprises a first exposed conductive face in a general direction toward the first conductive layer, wherein the first through-opening of the first conductive layer serves to expose the first exposed conductive face to an exterior face of the first conductive layer;
wherein the first test-signal path avoids conductive contact with the first exposed conductive face and walls of the first through-opening in the first conductive layer; and
a second test-signal path that comprises:
a second conductive pad located on the third conductive layer of the plurality of layers;
a second through-opening in the first and second conductive layers, wherein the second conductive pad comprises a second exposed conductive face in a general direction toward the first and second conductive layers, wherein the second through-opening of the first and second conductive layers serves to expose the second exposed conductive face to the exterior face of the first conductive layer; wherein the second test-signal path avoids conductive contact with the second exposed conductive face and walls of the second through-opening in the first and second conductive layers.

10. The multi-layer circuit board of claim 9, wherein the second conductive layer is located between the first and third conductive layers;
wherein the second test-signal path comprises:
the second conductive pad located on the third conductive layer;
the second through-opening in the first conductive layer;
a third through-opening in the second conductive layer;
wherein the second through-opening of the first conductive layer and the third through-opening of the second conductive layer cooperate to expose the second exposed conductive face to the exterior face of the first conductive layer through the second through-opening of the first conductive layer and the third through-opening of the second conductive layer;
wherein the second test-signal path avoids conductive contact with the second exposed conductive face and walls of the second through-opening in the first conductive layer and the third through-opening in the second conductive layer.

11. The multi-layer circuit board of claim 10, wherein the first, second, and third conductive layers are located at respective first, second, and third depths of the multi-layer circuit board.

12. The multi-layer circuit board of claim 9, wherein one or more alignment holes extend into and/or through the first conductive layer, wherein one or more of the one or more alignment holes are employable for receipt and/or alignment of one or more alignment pins of a non-dedicated off-board test connector.

13. The multi-layer circuit board of claim 12, wherein the one or more alignment holes stop at one or more corresponding depths partially through the multi-layer circuit board.

14. The multi-layer circuit board of claim 12, wherein the non-dedicated off-board test connector comprises a plurality of test probes;
wherein upon receipt by and/or alignment of the one or more of the one or more alignment holes with the one or more alignment pins of the non-dedicated off-board test connector:
a first test probe of the plurality of test probes is employable to follow the first test-signal passage through the exterior face of the first conductive layer, with avoidance of conductive contact with walls of the first through-opening in the first conductive layer, to couple with the first exposed conductive face of the first conductive pad on the second conductive layer; and
a second test probe of the plurality of test probes is employable to follow the second test-signal passage through the exterior face of the first conductive layer, with avoidance of conductive contact with walls of the second through-opening in the first conductive layer, to couple with the second exposed face of the second conductive pad on the second or third conductive layer.

15. The multi-layer circuit board of claim 9, wherein the second conductive layer is located between the first and third conductive layers;
wherein the second test-signal path comprises:
the second conductive pad located on the third conductive layer;
the second through-opening in the first conductive layer;
a third through-opening in the second conductive layer;
wherein the second through-opening of the first conductive layer and the third through-opening of the second conductive layer cooperate to expose the second exposed conductive face to the exterior face of the first conductive layer through the second through-opening of the first conductive layer and the third through-opening of the second conductive layer;
wherein the second test-signal path avoids conductive contact with the second exposed conductive face and walls of the second through-opening in the first conductive layer and the third through-opening in the second conductive layer;

wherein a plurality of alignment holes extend into and/or through the first conductive layer and stop at one or more corresponding depths partially through the multi-layer circuit board, wherein the plurality of alignment holes is matchable with and employable for receipt of a respective plurality of alignment pins of a non-dedicated off-board test connector;

wherein the non-dedicated off-board test connector comprises a plurality of test probes;

wherein upon receipt by the plurality of alignment holes of the respective plurality of alignment pins of the non-dedicated off-board test connector:

a first test probe of the plurality of test probes is employable to follow the first test-signal passage through the exterior face of the first conductive layer, with avoidance of conductive contact with walls of the first through-opening in the first conductive layer, to couple with the first exposed conductive face of the first conductive pad on the second conductive layer; and a second test probe of the plurality of test probes is employable to follow the second test-signal passage through the exterior face of the first conductive layer, with avoidance of conductive contact with walls of the second through-opening in the first conductive layer and the third through-opening in the second conductive layer, to couple with the second exposed face of the second conductive pad on the third conductive layer.

* * * * *

UNITED STATES PATENT AND TRADEMARK OFFICE
CERTIFICATE OF CORRECTION

PATENT NO. : 7,307,437 B1
APPLICATION NO. : 11/089379
DATED : December 11, 2007
INVENTOR(S) : Robert Dobbs et al.

It is certified that error appears in the above-identified patent and that said Letters Patent is hereby corrected as shown below:

In columns 4 and 5, lines 66-67 of column 4 and 1-15 of column 5, delete "Rather than mechanical or laser drilling, an etching process may be employed in an alternative implementation. After the copper circular pads 114 are created on the surface conductive layer 102 of the circuit board 100, with solder mask applied to separate the adjacent pads 114 from one another, the surface of the circuit board 100 is covered with photo resist. Using a photo mask revealing the locations of the openings 116, the photo resist is flashed and developed. Using the appropriate chemistry, well understood by those skilled in the art, the openings 116 are provided by etching. Forming the openings in the non-conductive layers 212, 214, 216, 218, 220 as required may also be accomplished through further etching, or the etching process may be supplemented at this stage by mechanical or laser drilling. The same solder plating and nickel-gold flash processes described above are then applied to the circuit board 100 to place the test connector arrangement into its final form." (Paragraph Repeated).

Signed and Sealed this

First Day of July, 2008

JON W. DUDAS
*Director of the United States Patent and Trademark Office*